US012770572B2

United States Patent

(12) United States Patent
Chen et al.

(10) Patent No.: US 12,770,572 B2
(45) Date of Patent: Oct. 20, 2026

(54) SHIFT REGISTER, GATE DRIVING CIRCUIT AND DISPLAY PANEL

(71) Applicants: Chongqing BOE Display Technology Co., Ltd., Chongqing (CN); BOE Technology Group Co., Ltd., Beijing (CN); Beijing BOE Technology Development Co., Ltd., Beijing (CN)

(72) Inventors: Teng Chen, Beijing (CN); Dawei Shi, Beijing (CN); Wentao Wang, Beijing (CN); Zongxi Xin, Beijing (CN); Qianjun Liu, Beijing (CN); Liang Tang, Beijing (CN)

(73) Assignees: CHONGQING BOE DISPLAY TECHNOLOGY CO. , LTD., Chongqing (CN); BEIJING BOE TECHNOLOGY DEVELOPMENT CO. , LTD., Beijing (CN)

( * ) Notice: Subject to any disclaimer, the term of this patent is extended or adjusted under 35 U.S.C. 154(b) by 86 days.

(21) Appl. No.: 18/992,569

(22) PCT Filed: Sep. 4, 2023

(86) PCT No.: PCT/CN2023/116843
§ 371 (c)(1),
(2) Date: Jan. 9, 2025

(87) PCT Pub. No.: WO2025/050266
PCT Pub. Date: Mar. 13, 2025

(65) Prior Publication Data
US 2026/0253550 A1 Aug. 27, 2026

(51) Int. Cl.
*G09G 3/3266* (2016.01)
*G09G 3/32* (2016.01)
*G11C 19/28* (2006.01)

(52) U.S. Cl.
CPC ............ *G09G 3/3266* (2013.01); *G09G 3/32* (2013.01); *G11C 19/28* (2013.01); *G09G 2310/0286* (2013.01); *G09G 2380/10* (2013.01)

(58) Field of Classification Search
CPC .................. G09G 3/3266; G09G 3/32; G09G 2310/0286; G09G 2380/10;
(Continued)

(56) References Cited

U.S. PATENT DOCUMENTS

| | | | | |
|---|---|---|---|---|
| 11,482,156 | B2 * | 10/2022 | Huang | G09G 3/3266 |
| 2015/0194952 | A1 | 7/2015 | Ofuji et al. | |

(Continued)

FOREIGN PATENT DOCUMENTS

| | | | |
|---|---|---|---|
| CN | 101777386 | A | 7/2010 |
| CN | 107093414 | A | 8/2017 |

(Continued)

OTHER PUBLICATIONS

International Search Report mailed on Dec. 22, 2023, received for PCT Application PCT/CN2023/116843, filed on Sep. 4, 2023, 5 pages including English Translation.

(Continued)

*Primary Examiner* — Amy Onyekaba
(74) *Attorney, Agent, or Firm* — XSENSUS LLP

(57) ABSTRACT

A shift register includes a first input sub-circuit configured to cause a first power supply voltage to be written into a first node, a second input sub-circuit configured to cause a signal of the first-type clock signal end to be written into the first node, a first output unit configured to cause a second power supply voltage to be written into a signal output end, a first control sub-circuit configured to cause a signal of a second-type clock signal end to be written into a second node, a second control sub-circuit configured to cause the signal of
(Continued)

the second-type clock signal end to be written into a third node, a third control sub-circuit configured to cause conduction between the third node and the second node, and a second output unit configured to cause the first power supply voltage to be written into the signal output end.

16 Claims, 7 Drawing Sheets

(58) Field of Classification Search
CPC ... G09G 3/30–3291; G09G 2300/0819; G09G 2300/0842–0871; G09G 2310/08; G11C 19/28
See application file for complete search history.

(56) References Cited

U.S. PATENT DOCUMENTS

| | | | | |
|---|---|---|---|---|
| 2020/0265877 | A1* | 8/2020 | Zheng | G11C 19/28 |
| 2021/0020089 | A1* | 1/2021 | Huang | G09G 3/3677 |
| 2021/0142709 | A1* | 5/2021 | Liu | G09G 3/20 |
| 2021/0241706 | A1* | 8/2021 | Huang | G09G 3/3674 |
| 2022/0230590 | A1* | 7/2022 | Kim | G09G 3/3291 |
| 2023/0107029 | A1* | 4/2023 | Wang | G09G 3/3241 345/206 |

FOREIGN PATENT DOCUMENTS

| | | | |
|---|---|---|---|
| CN | 107633833 | A | 1/2018 |
| CN | 110176204 | A | 8/2019 |
| CN | 110808012 | A | 2/2020 |
| CN | 112863586 | * | 5/2021 |
| KR | 20110077108 | A | 7/2011 |

OTHER PUBLICATIONS

Written Opinion mailed on Dec. 22, 2023, received for PCT Application PCT/CN2023/116843, filed on Sep. 4, 2023, 7 pages including English Translation.

* cited by examiner

SHIFT REGISTER, GATE DRIVING CIRCUIT AND DISPLAY PANEL

CROSS-REFERENCE TO RELATED APPLICATION

The present disclosure is a U.S. National Stage of International Application No. PCT/CN2023/116843, filed on Sep. 4, 2023, the contents of which are incorporated herein by reference in their entireties for all purposes.

TECHNICAL FIELD

The present disclosure relates to the field of display technologies, and particularly to a shift register, a gate driving circuit and a display panel.

BACKGROUND

With the development of optical technologies and semiconductor technologies, flat panel displays represented by the liquid crystal displays (LCD) and the organic light-emitting diode displays (OLED) have the characteristics of light and thin shape, low energy consumption, fast reaction speed, good color purity, and high contrast, etc., and are widely used in various electronic display products.

The gate on array (GOA) has the advantages of low cost, narrow border and low power consumption, and has been widely used in the LCD and OLED. The gate driving circuit includes shift registers that are cascaded in sequence, and there is a risk of failure of the output transistor of the shift register, which leads to defects such as screen splitting in the display panel.

The above information disclosed in the background section is only configured to enhance the understanding of the background of the present disclosure, and therefore it may include information that does not constitute prior art known to those ordinary skilled in the art.

SUMMARY

An object of the present disclosure is to provide a shift register, a gate driving circuit and a display panel to improve the output stability of the shift register.

According to a first aspect of the present disclosure, there is provided a shift register, including:

a first input sub-circuit, configured to cause, in response to a first level of a first-type clock signal end, a signal of a first power supply voltage end to be written into a first node;

a second input sub-circuit, configured to cause, in response to a first level on a signal input end, a signal of the first-type clock signal end to be written into the first node;

a first output sub-circuit, including a first output unit, where the first output unit is configured to cause, in response to a first level on the first node, a signal of a second power supply voltage end to be written into a signal output end;

a first control sub-circuit, configured to cause, in response to the first level on the signal input end, a signal of a second-type clock signal end to be written into a second node;

a second control sub-circuit, configured to cause, in response to the first level on the first node, the signal of the second-type clock signal end to be written into a third node;

a third control sub-circuit, configured to cause, in response to the first level of the first-type clock signal end, conduction between the third node and the second node; and a second output sub-circuit, including a second output unit, where the second output unit is configured to cause, in response to a first level on the second node, the signal of the first power supply voltage end to be written into the signal output end.

According to an embodiment of the present disclosure, the first control sub-circuit includes a first transistor, a first electrode of the first transistor is electrically connected to the second-type clock signal end, a third electrode of the first transistor is electrically connected to the signal input end, and a second electrode of the first transistor is electrically connected to the second node.

According to an embodiment of the present disclosure, the second input sub-circuit includes a second transistor, a first electrode of the second transistor is electrically connected to the first-type clock signal end, a third electrode of the second transistor is electrically connected to the signal input end, and a second electrode of the second transistor is electrically connected to the first node.

According to an embodiment of the present disclosure, the second control sub-circuit includes a fourth transistor, a first electrode of the fourth transistor is electrically connected to the second-type clock signal end, a third electrode of the fourth transistor is electrically connected to the first node, and a second electrode of the fourth transistor is electrically connected to the third node.

According to an embodiment of the present disclosure, the first input sub-circuit includes a third transistor, a first electrode of the third transistor is electrically connected to the first power supply voltage end, a third electrode of the third transistor is electrically connected to the first-type clock signal end, and a second electrode of the third transistor is electrically connected to the first node;

the third control sub-circuit includes a fifth transistor, a first electrode of the fifth transistor is electrically connected to the third node, a third electrode of the fifth transistor is electrically connected to the first-type clock signal end, and a second electrode of the fifth transistor is electrically connected to the second node;

the first output unit includes a seventh transistor, a first electrode of the seventh transistor is electrically connected to the second power supply voltage end, a third electrode of the seventh transistor is electrically connected to the first node, and a second electrode of the seventh transistor is electrically connected to the signal output end; and the second output unit includes an eighth transistor, a first electrode of the eighth transistor is electrically connected to the first power supply voltage end, a third electrode of the eighth transistor is electrically connected to the second node, and a second electrode of the eighth transistor is electrically connected to the signal output end.

According to an embodiment of the present disclosure, the shift register further includes a voltage regulator sub-circuit, where the voltage regulator sub-circuit is electrically connected to the second node and a fourth node respectively; and the voltage regulator sub-circuit is configured to write, under control of the signal of the first power supply voltage end, a voltage of the fourth node into the second node; where the fourth node is electrically connected to the first control sub-circuit and the third control sub-circuit.

According to an embodiment of the present disclosure, the voltage regulator sub-circuit includes a sixth transistor, a first electrode of the sixth transistor is electrically connected to the fourth node, a third electrode of the sixth transistor is electrically connected to the first power supply voltage end, and a second electrode of the sixth transistor is electrically connected to the second node.

According to an embodiment of the present disclosure, the first output sub-circuit further includes a first capacitor, a first electrode plate of the first capacitor is electrically connected to the first node, and a second electrode plate of the first capacitor is electrically connected to the second power supply voltage end; and the second output sub-circuit further includes a second capacitor, a first electrode plate of the second capacitor is electrically connected to the second node, and a second electrode plate of the second capacitor is electrically connected to the signal output end.

According to an embodiment of the present disclosure, a time length of the first level of the first-type clock signal end, and a time length of a first level of the second-type clock signal end are the same, and do not exceed one-third of a clock period.

According to an embodiment of the present disclosure, the first level of the first-type clock signal end is one-third of the clock period earlier than the first level of the second-type clock signal end.

According to an embodiment of the present disclosure, an amplitude of a second level of the first-type clock signal end, and an amplitude of a second level of the second-type clock signal end are greater than an amplitude of the signal of the second power supply voltage end.

According to a second aspect of the present disclosure, there is provided a gate driving circuit, including a plurality of shift registers cascaded in sequence, where the shift register is the shift register described above; in two adjacent stages of the shift registers, the signal output end of the shift register of a previous stage is electrically connected to the signal input end of the shift register of a next stage;

in the gate driving circuit, the signal input end of the shift register of a first stage is electrically connected to a start signal end;

the gate driving circuit includes a plurality of shift register groups, where the shift register group includes three shift registers, a first shift register, a second shift register and a third shift register, cascaded in sequence;

the first-type clock signal end of the first shift register is electrically connected to a third clock signal wiring, and the second-type clock signal end of the first shift register is electrically connected to a first clock signal wiring;

the first-type clock signal end of the second shift register is electrically connected to the first clock signal wiring, and the second-type clock signal end of the second shift register is electrically connected to a second clock signal wiring; and the first-type clock signal end of the third shift register is electrically connected to the second clock signal wiring, and the second-type clock signal end of the third shift register is electrically connected to the third clock signal wiring.

According to an embodiment of the present disclosure, an amplitude of a second level of the first clock signal wiring, an amplitude of a second level of the second clock signal wiring, and an amplitude of a second level of the third clock signal wiring are the same, and are 0.5~3 V higher than an amplitude of the signal of the second power supply voltage end.

According to an embodiment of the present disclosure, a time length of a first level of the first clock signal wiring, a time length of a first level of the second clock signal wiring, and a time length of a first level of the third clock signal wiring are the same, and do not exceed one-third of a clock period.

According to an embodiment of the present disclosure, a start timepoint of a first level of the first clock signal wiring differs by two-thirds of a clock period from a start timepoint of a first level of the third clock signal wiring following the first level of the first clock signal wiring;

a start timepoint of a first level of the second clock signal wiring differs by two-thirds of the clock period from the start timepoint of the first level of the first clock signal wiring following the first level of the second clock signal wiring; and the start timepoint of the first level of the third clock signal wiring differs by two-thirds of the clock period from the start timepoint of the first level of the second clock signal wiring following the first level of the third clock signal wiring.

According to a third aspect of the present disclosure, there is provided a display panel that includes the gate driving circuit described above.

It should be understood that the above general description and the subsequent detailed description are exemplary and explanatory only, and cannot limit the present disclosure.

BRIEF DESCRIPTION OF THE DRAWINGS

The accompanying drawings herein are incorporated into and form a part of the specification, illustrate embodiments consistent with the present disclosure, and are used in conjunction with the specification to explain the principles of the present disclosure. It is apparent that the accompanying drawings in the following description are only some of the embodiments of the present disclosure, and other accompanying drawings may be obtained based on these accompanying drawings without creative labor for those ordinary skilled in the art.

Figure 1:
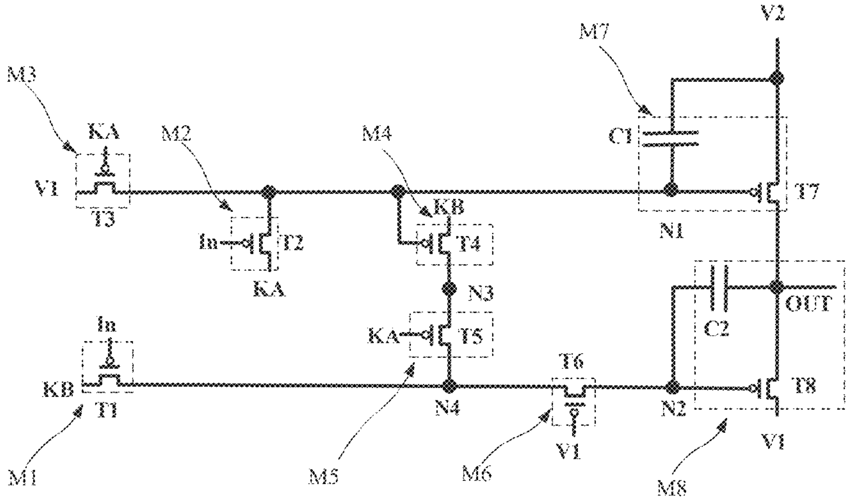
FIG. 1 is an equivalent circuit diagram of a shift register in an embodiment of the present disclosure.

Descriptions for reference numerals of main components in the drawings are as follows.

M1, first control sub-circuit; M2, second input sub-circuit; M3, first input sub-circuit; M4, second control sub-circuit; M5, third control sub-circuit; M6, voltage regulator sub-circuit; M7, first output sub-circuit; M8, second output sub-circuit; T1, first transistor; T2, second transistor; T3, third transistor; T4, fourth transistor; T5, fifth transistor; T6, sixth transistor; T7, seventh transistor; T8, eighth transistor; C1, first capacitor; C2, second capacitor; N1, first node; N2, second node; N3, third node; N4, fourth node; V1, first power supply voltage; V2, second power supply voltage; VGH, high level power supply voltage; VGL, low level power supply voltage; GSTV, start signal; KA, first-type clock signal; KB, second-type clock signal; CK1, first clock signal; CK2, second clock signal; CK3, third clock signal; In, signal input end; OUT, signal output end; SRS, shift register group; SR1, first shift register; SR2, second shift register; SR3, third shift register.

DETAILED DESCRIPTION

Exemplary embodiments are now described more comprehensively with reference to the accompanying drawings. However, the exemplary embodiments are capable of being implemented in a variety of forms, and should not be construed as being limited to the examples set forth herein. Rather, the provision of these embodiments allows for the present disclosure to be more comprehensive and complete, and conveys the idea of the exemplary embodiments in a comprehensive manner to those skilled in the art. The same reference numerals in the drawings indicate the same or similar structures, and therefore their detailed descriptions will be omitted. In addition, the accompanying drawings are only schematic illustrations of the present disclosure, and are not necessarily drawn to scale. The described features, structures or characteristics may be combined in one or more embodiments in any suitable manner. In the following description, many specific details are provided to give a full understanding of the embodiments of the present disclosure.

The described features, structures or characteristics may be combined in one or more embodiments in any suitable manner. In the following description, many specific details are provided to give a full understanding of the embodiments of the present disclosure. However, those skilled in the art will realize that the technical solutions of the present disclosure can be practiced without one or more of the specific details, or can use other methods, components, materials, etc. In other cases, well-known structures, materials or operations are not shown or described in detail to avoid obscuring of the main technical ideas of the present disclosure.

The terms “a” and “an” are used for indicating existence of one or more elements/components/etc.; and the terms “include” and “have” are used for indicating an open-ended inclusion and mean that there may be additional elements/components/etc. in addition to the listed elements/components/etc. The terms “first”, “second”, etc. are used merely as markers but not as quantitative limitations to the objects thereof.

In the embodiments of the present disclosure, a transistor refers to an element that at least includes three terminals, i.e., a gate, a source and a drain. The transistor is provided with a channel region between the drain (drain electrode terminal, drain region or drain electrode) and the source (source electrode terminal, source region or source electrode), and the current may flow through the source, the channel region and the drain. The channel region refers to the region through which the current mainly flows. In the embodiments of the present disclosure, the functions of the “source” and the “drain” are sometimes interchanged in the case where a transistor of an opposite polarity is used, or in the case where the direction of the current in the operation of the circuit is changed, etc., i.e., the “source” and the “drain” may be interchanged. In the embodiments of the present disclosure, for any transistor, one of the “source” and the “drain” is referred to as a first electrode of the transistor, the other one of the “source” and the “drain” is referred to as a second electrode of the transistor, and the gate is referred to as a third electrode of the transistor.

In the prior art, with the use of vehicle-mounted products and tandem (stacked) devices, the voltage difference between the cathode and the anode of the OLED is constantly increased (the tandem device causes the Voled to be increased from 4 V to about 8 V), which results in that the voltage difference between the high level power supply voltage and the low level power supply voltage of the gate driving circuit (GOA) is constantly increased. Under such a high voltage difference operation environment, the threshold voltage Vth of the thin film transistor is prone to positive bias during the aging phase of the manufacture procedure of the product and in the high temperature use environment at a later phase, resulting in the failure of the output transistor; and particularly, for the output transistor with the highest W/L (breadth length ratio), the threshold voltage Vth is caused to be closest to the high level power supply voltage. In the related art, the control voltage on the output transistor comes from the high level power supply voltage and the low level power supply voltage, and when the threshold voltage Vth of the output transistor is close to 0 V due to the threshold shift of the output transistor, the gate-source voltage difference of the output transistor may not be capable of causing the output transistor to be turned off, which results in the failure of the output of the shift register, and leads to the adverse effect of screen splitting.

The present disclosure provides a shift register. As shown in FIG. 1, the shift register may include a first input sub-circuit M3, a second input sub-circuit M2, a first control sub-circuit M1, a second control sub-circuit M4, a third control sub-circuit M5, a first output sub-circuit M7, and a second output sub-circuit M8.

The first input sub-circuit M3 is configured to cause, in response to a first level of a first-type clock signal end (configured to load a first-type clock signal KA), a signal of a first power supply voltage end (configured to load a first power supply voltage V1) to be written into a first node N1.

The second input sub-circuit M2 is configured to cause, in response to a first level on a signal input end In, a voltage of the first-type clock signal end (configured to load the first-type clock signal KA) to be written into the first node N1.

The first output sub-circuit M7 includes a first output unit. The first output unit is configured to cause, in response to a first level on the first node N1, a signal on a second power supply voltage end (configured to load a second power supply voltage V2) to be written into a signal output end OUT.

The first control sub-circuit M1 is configured to cause, in response to the first level on the signal input end In, a voltage of a second-type clock signal end (configured to load a second-type clock signal KB) to be written into a second node N2.

The second control sub-circuit M4 is configured to cause, in response to the first level on the first node N1, the voltage of the second-type clock signal end to be written into a third node N3.

The third control sub-circuit M5 is configured to cause, in response to the first level of the first-type clock signal end, conduction between the third node N3 and the second node N2.

The second output sub-circuit M8 includes a second output unit. The second output unit is configured to cause, in response to a first level on the second node N2, the signal of the first power supply voltage end to be written into the signal output end OUT.

In an embodiment of the present disclosure, the first level is a low level, and the second level is a high level; the first power supply voltage V1 is a low level power supply voltage VGL, and the second power supply voltage V2 is a high level power supply voltage VGH.

In another embodiment of the present disclosure, the first level is a high level, and the second level is a low level; the first power supply voltage V1 is a high level power supply voltage VGH, and the second power supply voltage V2 is a low level power supply voltage VGL.

The shift register provided in the embodiments of the present disclosure includes the first output sub-circuit M7 and the second output sub-circuit M8. When the first output sub-circuit M7 outputs, the second power supply voltage V2 loaded on the second power supply voltage end may be loaded to the signal output end OUT, thereby causing the shift register to output the second power supply voltage V2. The output of the first output sub-circuit M7 is controlled by the voltage on the first node N1. When the second level is loaded on the first node N1, the first output sub-circuit M7 may be caused to be cut off. In this embodiment, the second level on the first node N1 comes from the second level of the first-type clock signal KA, rather than from the second power supply voltage V2. Therefore, through adjustment on the second level of the first-type clock signal KA, the voltage of the first node N1 is not limited to the second power supply voltage V2, eliminating the risk of a failure of the turn-off of the first output sub-circuit M7 caused when the second level of the first node N1 is inevitably the second power supply voltage V2. For example, in an example, an amplitude of the second level of the first-type clock signal KA may be made higher than an amplitude of the second power supply voltage V2, ensuring that the amplitude of the second level of the first node N1 is inevitably higher than the amplitude of the second power supply voltage V2, thereby ensuring that the first output sub-circuit M7 can be cut off inevitably when the first node N1 is at the second level. For further example, in another example, when the second level on the first node N1 is not sufficient to cause the first output sub-circuit M7 to be cut off, the second level of the first-type clock signal KA may be adjusted upwardly without the need for adjustment on the second power supply voltage V2, thereby enabling the first output sub-circuit M7 to be cut off in response to the second level on the first node N1.

When the second output sub-circuit M8 outputs, the first power supply voltage V1 may be loaded to the signal output end OUT, thereby causing the shift register to output the first power supply voltage V1. The output of the second output sub-circuit M8 is controlled by the voltage on the second node N2. When the second level is loaded on the second node N2, the second output sub-circuit M8 may be cut off. In this embodiment, the second level on the second node N2 comes from the second level of the second-type clock signal KB, rather than from the second power supply voltage V2. Therefore, through adjustment on the second level of the second-type clock signal KB, the voltage of the second node N2 is not limited to the second power supply voltage V2, eliminating the risk of a failure of the turn-off of the second output sub-circuit M8 caused when the second level of the second node N2 is inevitably the second power supply voltage V2. For example, in an example, an amplitude of the second level of the second-type clock signal KB may be made higher than an amplitude of the second power supply voltage V2, ensuring that the amplitude of the second level of the second node N2 is inevitably higher than the amplitude of the second power supply voltage V2, thereby ensuring that the second output sub-circuit M8 can be cut off inevitably when the second node N2 is at the second level. For further example, in another example, when the second level on the second node N2 is not sufficient to cause the second output sub-circuit M8 to be cut off, the amplitude of the second level of the second-type clock signal KB may be adjusted upwardly without the need for adjustment on the second power supply voltage V2, thereby enabling the second output sub-circuit M8 to be cut off in response to the second level on the second node N2.

In summary, the embodiments of the present disclosure provide a shift register in which the amplitude of the second level on the first node N1, and the amplitude of the second level on the second node N2 may be different from the amplitude of the second power supply voltage V2, and the voltage adjustment thereof may be adjusted independently of the adjustment of the second power supply voltage V2. This allows the shift register to ensure, through the setting of the second level of the first-type clock signal KA, and the setting of the second level of the second-type clock signal KB, that the first output sub-circuit M7 and the second output sub-circuit M8 can be cut off in response to the second levels of their control ends, thereby ensuring the stable output of the shift register.

The shift register of the embodiments of the present disclosure is described in detail below in connection with the accompanying drawings.

In an embodiment of the present disclosure, referring to FIG. 1, the first output sub-circuit M7 further includes a first capacitor C1. A first electrode plate of the first capacitor C1 is electrically connected to the first node N1. Further, a second electrode plate of the first capacitor C1 is electrically connected to the second power supply voltage end. It can be understood that in some other embodiments of the present disclosure, the second electrode plate of the first capacitor C1 may also be electrically connected to the first power supply voltage end.

In an embodiment of the present disclosure, referring to FIG. 1, the second output sub-circuit M8 further includes a second capacitor C2. A first electrode plate of the second capacitor C2 is electrically connected to the second node N2. Further, a second electrode plate of the second capacitor C2 is electrically connected to the signal output end OUT. It can be understood that in some other embodiments of the present disclosure, the second electrode plate of the second capacitor C2 may also be electrically connected to the second power supply voltage end or the first power supply voltage end.

In an embodiment of the present disclosure, the shift register further includes a voltage regulator sub-circuit M6. The first control sub-circuit M1 and the third control sub-circuit M5 are both connected to the second node N2 via the voltage regulator sub-circuit M6. The voltage regulator sub-circuit M6 is configured to be electrically conductive in response to the signal on the first power supply voltage end.

For example, the first control sub-circuit M1 is configured to cause, in response to the first level on the signal input end In, a voltage of the second-type clock signal end (configured to load the second-type clock signal KB) to be written into a fourth node N4. The third control sub-circuit M5 is configured to cause, in response to the first level of the first-type clock signal end, a signal on the third node N3 to be written into the fourth node N4. The voltage regulator sub-circuit M6 is connected to the second node N2 and the fourth node N4 respectively. The voltage regulator sub-circuit M6 is configured to write, under control of the signal of the first power supply voltage end, a voltage of the fourth node N4 into the second node N2. In an embodiment of the present disclosure, the first control sub-circuit M1 includes a first transistor T1. A first electrode of the first transistor T1 is electrically connected to the second-type clock signal end. A third electrode of the first transistor T1 is electrically connected to the signal input end In. A second electrode of the first transistor T1 is electrically connected to the second node N2. It can be understood that in some other embodiments of the present disclosure, the first control sub-circuit M1 may include a plurality of first transistors T1 connected in series or in parallel.

In an embodiment of the present disclosure, the second input sub-circuit M2 includes a second transistor T2. A first electrode of the second transistor T2 is electrically connected to the first-type clock signal end. A third electrode of the second transistor T2 is electrically connected to the signal input end In. A second electrode of the second transistor T2 is electrically connected to the first node N1. It can be understood that in some other embodiments of the present disclosure, the second input sub-circuit M2 may include a plurality of second transistors T2 connected in series or in parallel.

In an embodiment of the present disclosure, the first input sub-circuit M3 includes a third transistor T3. A first electrode of the third transistor T3 is electrically connected to the first power supply voltage end. A third electrode of the third transistor T3 is electrically connected to the first-type clock signal end. A second electrode of the third transistor T3 is electrically connected to the first node N1. It can be understood that in some other embodiments of the present disclosure, the first input sub-circuit M3 may include a plurality of third transistors T3 connected in series or in parallel.

In an embodiment of the present disclosure, the second control sub-circuit M4 includes a fourth transistor T4. A first electrode of the fourth transistor T4 is electrically connected to the second-type clock signal end. A third electrode of the fourth transistor T4 is electrically connected to the first node N1. A second electrode of the fourth transistor T4 is electrically connected to the third node N3. It can be understood that in some other embodiments of the present disclosure, the second control sub-circuit M4 may include a plurality of fourth transistors T4 connected in series or in parallel.

In an embodiment of the present disclosure, the third control sub-circuit M5 includes a fifth transistor T5. A first electrode of the fifth transistor T5 is electrically connected to the third node N3. A third electrode of the fifth transistor T5 is electrically connected to the first-type clock signal end. A second electrode of the fifth transistor T5 is electrically connected to the second node N2. It can be understood that in some other embodiments of the present disclosure, the third control sub-circuit M5 may include a plurality of fifth transistors T5 connected in series or in parallel.

In an embodiment of the present disclosure, the voltage regulator sub-circuit M6 includes a sixth transistor T6. A first electrode of the sixth transistor T6 is electrically connected to the second electrode of the first transistor T1, and the second electrode of the fifth transistor T5 respectively. A third electrode of the sixth transistor T6 is electrically connected to the first power supply voltage end. A second electrode of the sixth transistor T6 is electrically connected to the second node N2. It can be understood that in some other embodiments of the present disclosure, the voltage regulator sub-circuit M6 may include a plurality of sixth transistors T6 connected in series or in parallel.

In an embodiment of the present disclosure, the first output unit includes a seventh transistor T7. A first electrode of the seventh transistor T7 is electrically connected to the second power supply voltage end. A third electrode of the seventh transistor T7 is electrically connected to the first node N1. A second electrode of the seventh transistor T7 is electrically connected to the signal output end OUT. It can be understood that in some other embodiments of the present disclosure, the first output unit may include a plurality of seventh transistors T7 connected in series or in parallel.

In an embodiment of the present disclosure, the second output unit includes an eighth transistor T8. A first electrode of the eighth transistor T8 is electrically connected to the first power supply voltage end. A third electrode of the eighth transistor T8 is electrically connected to the second node N2. A second electrode of the eighth transistor T8 is electrically connected to the signal output end OUT. It can be understood that in some other embodiments of the present disclosure, the second output unit may include a plurality of eighth transistors T8 connected in series or in parallel.

In an example, referring to FIG. 1, the first control sub-circuit M1 includes the first transistor T1. The first electrode of the first transistor T1 is configured to load the second-type clock signal KB. The third electrode of the first transistor T1 is electrically connected to the signal input end In. The second electrode of the first transistor T1 is electrically connected to the second node N2. The second input sub-circuit M2 includes the second transistor T2. The first electrode of the second transistor T2 is configured to load the first-type clock signal KA. The third electrode of the second transistor T2 is electrically connected to the signal input end In. The second electrode of the second transistor T2 is electrically connected to the first node N1. The first input sub-circuit M3 includes the third transistor T3. The first electrode of the third transistor T3 is configured to load the first power supply voltage V1. The third electrode of the third transistor T3 is configured to load the first-type clock signal KA. The second electrode of the third transistor T3 is electrically connected to the first node N1. The second control sub-circuit M4 includes the fourth transistor T4. The first electrode of the fourth transistor T4 is configured to load the second-type clock signal KB. The third electrode of the fourth transistor T4 is electrically connected to the first node N1. The second electrode of the fourth transistor T4 is electrically connected to the third node N3. The third control sub-circuit M5 includes the fifth transistor T5. The first electrode of the fifth transistor T5 is electrically connected to the third node N3. The third electrode of the fifth transistor T5 is configured to load the first-type clock signal KA. The second electrode of the fifth transistor T5 is electrically connected to the second node N2. The voltage regulator sub-circuit M6 includes the sixth transistor T6. The first electrode of the sixth transistor T6 is electrically connected to the second electrode of the first transistor T1, and the second electrode of the fifth transistor T5 respectively. The third electrode of the sixth transistor T6 is configured to load the first power supply voltage V1. The second electrode of the sixth transistor T6 is electrically connected to the second node N2. The first output unit includes the seventh transistor T7. The first electrode of the seventh transistor T7 is configured to load the second power supply voltage V2. The third electrode of the seventh transistor T7 is electrically connected to the first node N1. The second electrode of the seventh transistor T7 is electrically connected to the signal output end OUT. The second output unit includes the eighth transistor T8. The first electrode of the eighth transistor T8 is configured to load the first power supply voltage V1. The third electrode of the eighth transistor T8 is electrically connected to the second node N2. The second electrode of the eighth transistor T8 is electrically connected to the signal output end OUT.

In an example, the first transistor T1 to the eighth transistor T8 described above are all P-type thin film transistors. In this example, the first level is a low level, the second level is a high level, the first power supply voltage V1 is a low level power supply voltage VGL, and the second power supply voltage V2 is a high level power supply voltage VGH. Further, the seventh transistor T7 and the eighth transistor T8 are thin film transistors with large breadth length ratios, enabling the shift register to have a large driving capability. The rest are ordinary thin film transistors, and are used as switches. The first capacitor C1 and the second capacitor C2 have the functions of energy storage and voltage regulating, thereby improving the stability of the shift register. In addition, the transistors in this exemplary embodiment may be enhancement-type transistors or depletion-type transistors.

In another example, the first transistor T1 to the eighth transistor T8 described above are all N-type thin film transistors. In this example, the first level is a high level, the second level is a low level, the first power supply voltage V1 is a high level power supply voltage VGH, and the second power supply voltage V2 is a low level power supply voltage VGL. Further, the seventh transistor T7 and the eighth transistor T8 are thin film transistors with large breadth length ratios, enabling the shift register to have a large driving capability. The rest are ordinary thin film transistors, and are used as switches. The first capacitor C1 and the second capacitor C2 have the functions of energy storage and voltage regulating, thereby improving the stability of the shift register. In addition, the transistors in this exemplary embodiment may be enhancement-type transistors or depletion-type transistors. The shift register provided in this exemplary embodiment of the present disclosure may include eight thin film transistors and two capacitors, the number of transistors is small, and the circuit structure is relatively simple. As a result, the shift register circuit, as well as the gate driving circuit including the shift register circuit, not only can effectively reduce the area occupied by the circuit layout, thus facilitating the design of the display panel with a narrow border, but also can simplify the preparation process and reduce the cost.

In an embodiment of the present disclosure, the amplitude (i.e., the amplitude of the second level of the first-type clock signal end) of the second level of the first-type clock signal KA is higher than the amplitude of the second power supply voltage V2. In this way, even if a threshold shift occurs in the first output unit, for example, the threshold is shifted to be close to 0, at this time, the voltage of the second level of the first-type clock signal is also capable of causing the first output unit to remain cut-off. In an example, when the second level of the first-type clock signal KA is a high level, the amplitude of the second level of the first-type clock signal KA is a voltage value of the second level of the first-type clock signal KA, and the voltage value is greater than a voltage value of the high level power supply voltage VGH. In another example, when the second level of the first-type clock signal KA is a low level, the voltage value of the second level of the first-type clock signal KA is a negative value, the amplitude of the second level of the first-type clock signal KA is an absolute value of the voltage value, and the voltage value of the second level of the first-type clock signal KA is less than the voltage value of the low level power supply voltage VGL. Taking the seventh transistor being a P-type transistor as an example, even if the threshold voltage of the seventh transistor is shifted to 0 V, when the first node N1 is at the second level, the gate-source voltage difference VGS of the seventh transistor T7 is greater than 0, ensuring that the seventh transistor T7 is cut off, and avoiding an output abnormality caused by the fact that the seventh transistor T7 cannot be cut off.

In an example, the amplitude of the second level of the first-type clock signal KA is 0.5~3 V higher than the amplitude of the second power supply voltage V2, for example, the amplitude of the second level of the first-type clock signal KA is 0.5 V, 1 V, 1.5 V, 2 V, 2.5 V, or 3 V higher than the amplitude of the second power supply voltage V2.

In an example, the amplitude of the second level of the first-type clock signal KA is 10%~20% higher than the amplitude of the second power supply voltage V2.

By way of example, the second power supply voltage V2 is 7 V, and the voltage of the second level of the first-type clock signal KA is 8 V.

In an embodiment of the present disclosure, the amplitude (i.e., the amplitude of the second level of the second-type clock signal end) of the second level of the second-type clock signal KB is higher than the amplitude of the second power supply voltage V2. In this manner, even if a threshold shift occurs in the second output unit, for example, the threshold is shifted to be close to 0, at this time, the voltage of the second level of the second-type clock signal is also capable of causing the second output unit to remain cut-off. In an example, when the second level of the second-type clock signal KB is a high level, the amplitude of the second level of the second-type clock signal KB is a voltage value of the second level of the second-type clock signal KB, and the voltage value is greater than a voltage value of the high level power supply voltage VGH. In another example, when the second level of the second-type clock signal KB is a low level, the voltage value of the second level of the second-type clock signal KB is a negative value, the amplitude of the second level of the second-type clock signal KB is an absolute value of the voltage value, and the voltage value of the second level of the second-type clock signal KB is less than the voltage value of the low level power supply voltage VGL.

Taking the eighth transistor being a P-type transistor as an example, even if the threshold voltage of the eighth transistor T8 is shifted to 0 V, when the second node N2 is at a second level, the gate-source voltage difference VGS of the eighth transistor T8 is greater than 0, ensuring that the eighth transistor T8 is cut off, and avoiding an output abnormality caused by the fact that the eighth transistor T8 cannot be cut off.

In an example, the amplitude of the second level of the second-type clock signal KB is 0.5~3 V higher than the amplitude of the second power supply voltage V2, for example, the amplitude of the second level of the second-type clock signal KB is 0.5 V, 1 V, 1.5 V, 2 V, 2.5 V, or 3 V higher than the amplitude of the second power supply voltage V2.

In an example, the amplitude of the second level of the second-type clock signal KB is 10%~20% higher than the amplitude of the second power supply voltage V2.

By way of example, the second power supply voltage V2 is 7 V, and the voltage of the second level of the second-type clock signal KB is 8 V.

In an embodiment of the present disclosure, the voltage of the second level of the first-type clock signal KA, and the voltage of the first level of the first-type clock signal KA are equal in absolute value, but have opposite electrical properties. For example, the voltage of the second level of the first-type clock signal KA is 8 V, and the voltage of the first level of the first-type clock signal KA is-8 V.

In an embodiment of the present disclosure, the voltage of the second level of the second-type clock signal KB, and the voltage of the first level of the second-type clock signal KB are equal in absolute value, but have opposite electrical properties. For example, the voltage of the second level of the second-type clock signal KB is 8 V, and the voltage of the first level of the second-type clock signal KB is-8 V.

In an embodiment of the present disclosure, a time length of the first level (i.e., the first level of the first-type clock signal end) of the first-type clock signal KA, and a time length of the first level (i.e., the first level of the second-type clock signal end) of the second-type clock signal KB are the same, and do not exceed one-third of a clock period. In other words, both the duty ratio of the first level (i.e., the first level of the first-type clock signal end) of the first-type clock signal KA, and the duty ratio of the first level (i.e., the first level of the second-type clock signal end) of the second-type clock signal KB do not exceed ⅓.

In an embodiment of the present disclosure, the first level of the first-type clock signal KA is one-third of a clock period earlier than the first level of the second-type clock signal KB. In this way, the shift register can be made to output a first level scanning signal with a length of two-thirds of the clock period. Further, the time length of the first level of the first-type clock signal KA is the same as the time length of the first level of the second-type clock signal KB.

Figure 2:
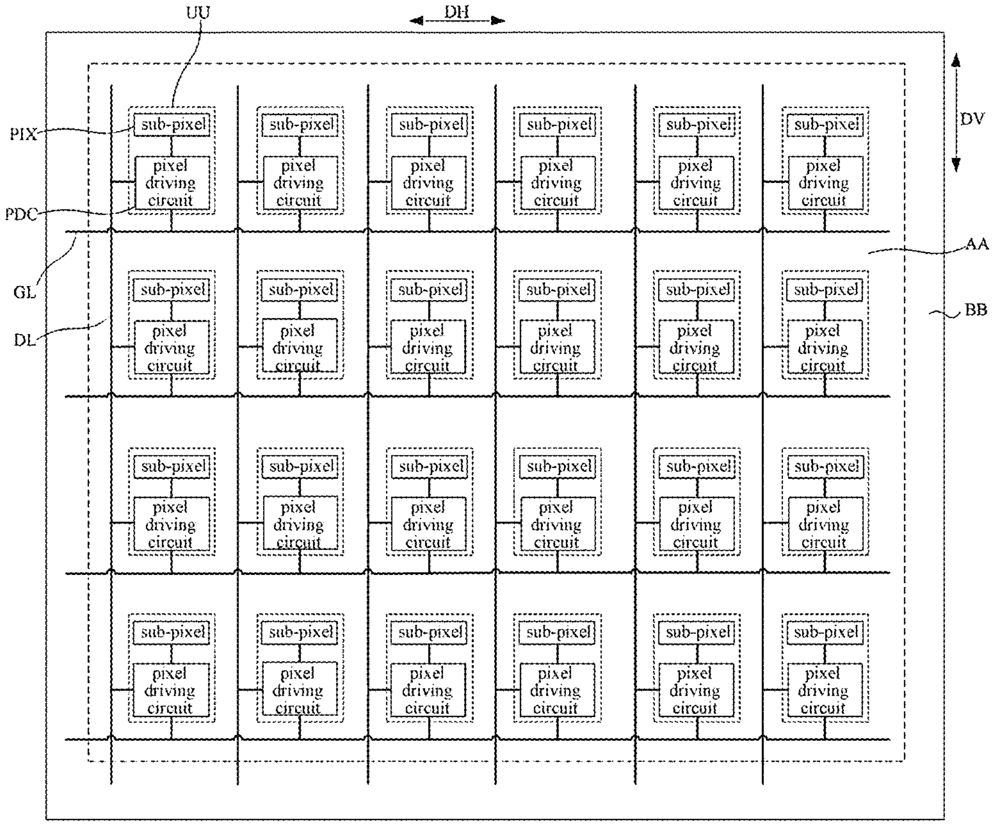
FIG. 2 is a schematic structural diagram of a display panel in an embodiment of the present disclosure.

The embodiments of the present disclosure may also provide a display panel and a gate driving circuit applied to the display panel. Referring to FIG. 2, the display panel includes a display region AA and a peripheral region BB located on at least a side of the display region AA. In the display region AA, the display panel is provided with display units distributed in an array. The display unit includes a sub-pixel PIX and a pixel driving circuit PDC for driving the sub-pixel PIX. The display panel is not provided with a display unit in the peripheral region BB, or the display unit provided in the peripheral region BB is not configured for image display. Referring to FIG. 2, the display panel is provided with a plurality of strobe wirings GL, in the display region AA, extending along the row direction DH. The strobe wirings GL are provided in one-to-one correspondence with the display unit rows. The pixel driving circuits PDC of the display units of the display unit row are all electrically connected to the corresponding strobe wiring GL. The display panel is further provided with a plurality of data wirings DL, in the display region AA, extending along the column direction DV. The data wirings DL are provided in one-to-one correspondence with the display unit columns. The pixel driving circuits PDC of the display units of the display unit column are all electrically connected to the corresponding data wiring DL. In this way, the pixel driving circuit PDC of each display unit is connected to one strobe wiring GL and one data wiring DL. When a strobe signal is loaded on the strobe wiring GL, a driving voltage loaded on the data wiring DL may be caused to be written into the pixel driving circuit PDC, thereby enabling the pixel driving circuit PDC to control the brightness of the sub-pixel PIX according to the driving voltage as written.

Optionally, the display panel may be a display panel of a vehicle-mounted display device.

In an embodiment of the present disclosure, the display panel may be a liquid crystal display panel. At this time, the pixel driving circuit PDC may be a switching transistor.

In other embodiments of the present disclosure, the sub-pixel PIX may be a current-driven light-emitting element, for example, it may be an OLED, a PLED, a QLED, a Micro LED, a Mini LED, or other types of light-emitting elements. Optionally, the pixel driving circuit PDC at least includes a data writing transistor, a driving transistor and a storage capacitor. A gate of the driving transistor may be electrically connected to an electrode plate of the storage capacitor. A first electrode of the data writing transistor may be electrically connected to the data wiring DL, and a gate of the data writing transistor may be electrically connected to the strobe wiring GL. The pixel driving circuit PDC is configured such that when the strobe signal is loaded on the strobe wiring GL, the data writing transistor is turned on, causing the driving voltage on the data wiring DL to be written into the gate of the driving transistor and the storage capacitor. When the data writing transistor is turned off, the driving voltage may be held by the storage capacitor. The driving transistor is capable of outputting, under control of a voltage on the gate thereof, a driving current to drive the sub-pixel PIX to emit light. It can be understood that the pixel driving circuit PDC of the embodiments of the present disclosure may also include other transistors or capacitors, enabling the pixel driving circuit PDC to have better driving performance. For example, the pixel driving circuit PDC may be a 7T1C (seven thin film transistors and one storage capacitor) pixel driving circuit, an 8T1C (eight thin film transistors and one storage capacitor) pixel driving circuit, or a pixel driving circuit of other architectures.

It can be understood that the display panel may also be provided with other wirings configured to drive the pixel driving circuit PDC as desired, such as a light-emitting control wiring configured to control whether a driving power supply voltage can be loaded to the pixel driving circuit PDC, a gate reset wiring configured to reset the gate of the driving transistor, and an electrode reset wiring configured to reset a pixel electrode of the light-emitting element. In some embodiments, a light-emitting control signal may be loaded on the light-emitting control wiring, a gate reset control signal may be loaded on the gate reset wiring, and an electrode reset control signal may be loaded on the electrode reset wiring. When driving the sub-pixel rows row by row for image display, the scanning signal may be loaded to at least one of the strobe wiring GL, the light-emitting control wiring, the gate reset wiring, and the electrode reset wiring.

Figure 3:
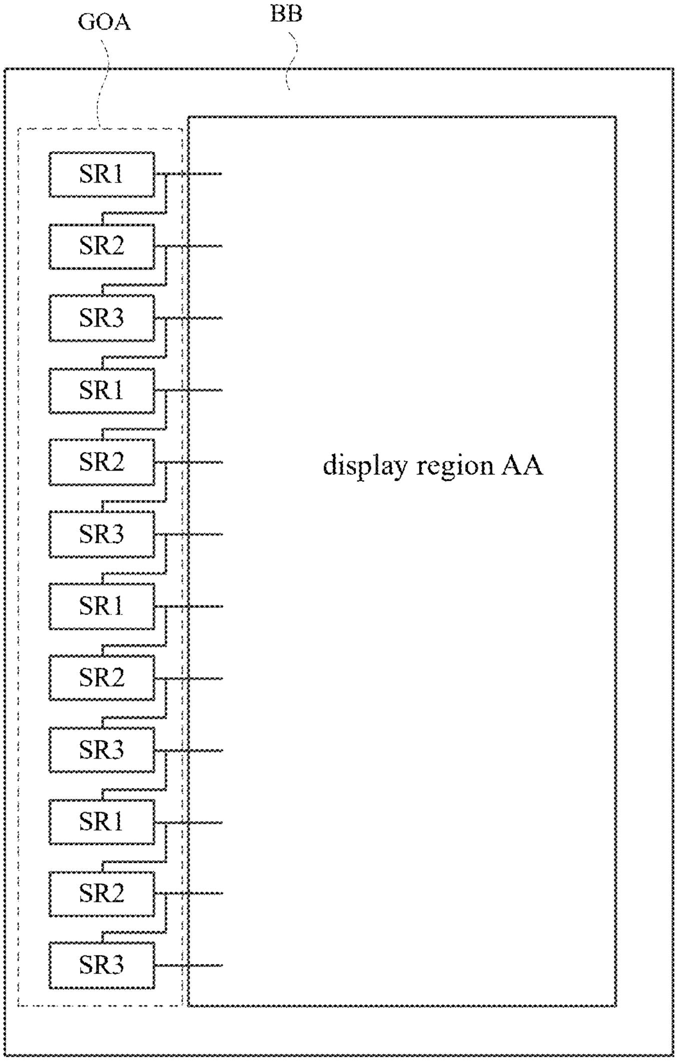
FIG. 3 is a schematic structural diagram of a display panel in an embodiment of the present disclosure.

Referring to FIG. 3, the gate driving circuit GOA is provided on one side of the display region AA, and of course may also be provided on two sides of the display region AA. The gate driving circuit may include a plurality of shift registers SR (e.g., a first shift register SR1, a second shift register SR2 and a third shift register SR3) cascaded in sequence. Each of the shift registers SR is the shift register SR as described in the above embodiments. In some embodiments, in two adjacent stages of the shift registers SR, the signal output end of the shift register SR of a previous stage is connected to the signal input end of the shift register SR of a next stage. The scanning signal (the voltage is the first power supply voltage V1) output from the signal output end of the shift register SR may be used as one or more of the strobe signal, the light-emitting control signal, the gate reset control signal, and the electrode reset control signal of the display panel.

For example, the output ends of the shift registers SR of the gate driving circuit are electrically connected to the strobe wirings GL in one-to-one correspondence, causing the first level scanning signal output from the shift register SR to be the strobe signal on the strobe wiring GL connected to the shift register SR.

Figure 4:
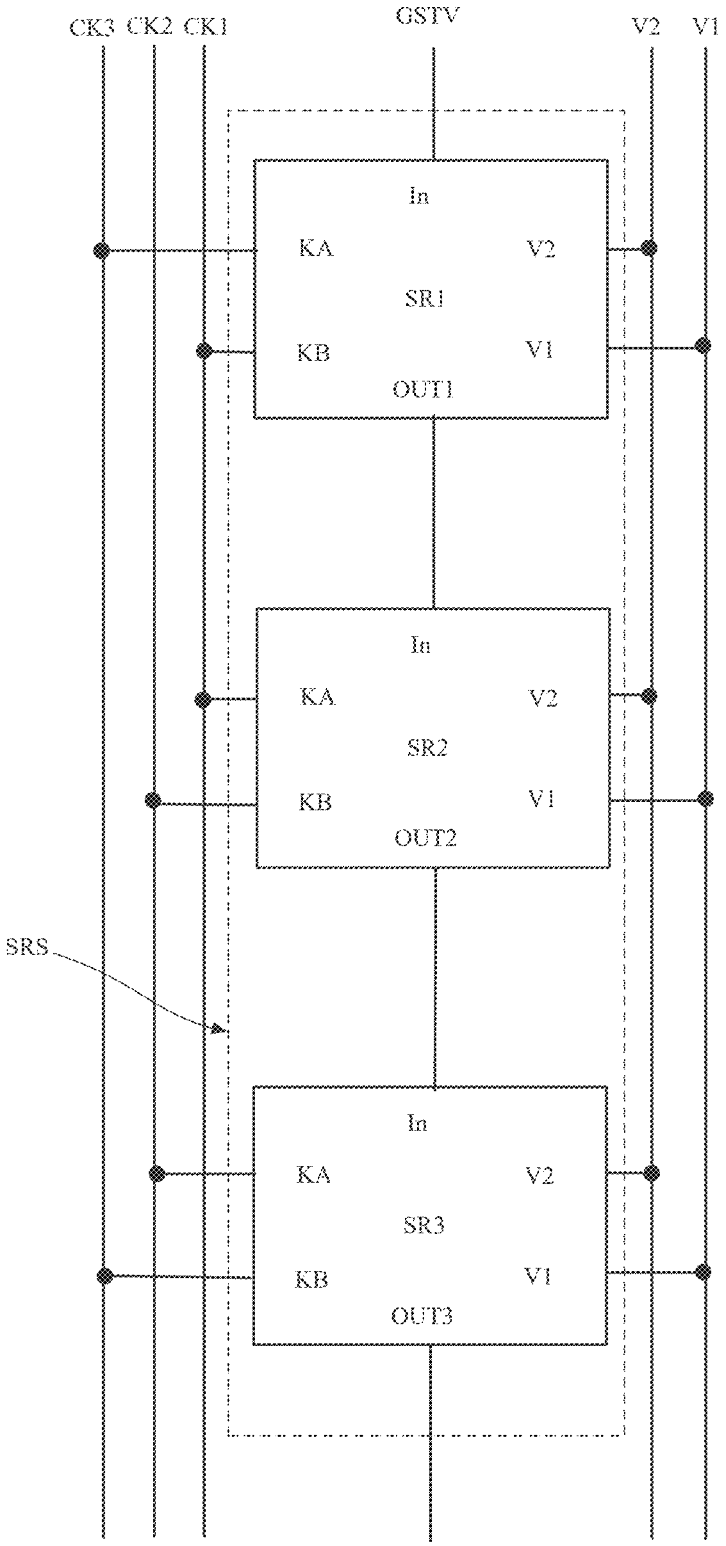
FIG. 4 is a schematic structural diagram of a gate driving circuit in an embodiment of the present disclosure.

In an embodiment of the present disclosure, referring to FIG. 4, the gate driving circuit includes a plurality of shift register groups SRS. The shift register group SRS includes a first shift register SR1, a second shift register SR2 and a third shift register SR3 cascaded in sequence.

Figure 11:
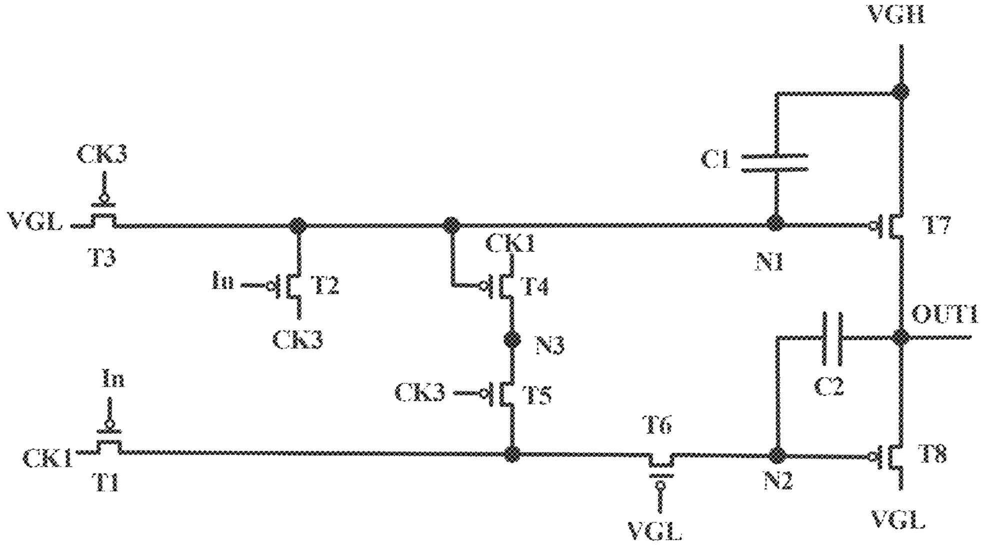
FIG. 11 is a schematic diagram of a first shift register in an embodiment of the present disclosure.

In this exemplary embodiment, the display panel is provided, in the peripheral region BB, with a first clock signal wiring, a second clock signal wiring and a third clock signal wiring that are configured to cooperate with the gate driving circuit. The first clock signal wiring is configured to load a first clock signal CK1 to drive the first shift register SR1 and the second shift register SR2. The second clock signal wiring is configured to load a second clock signal CK2 to drive the second shift register SR2 and the third shift register SR3. The third clock signal wiring is configured to load a third clock signal CK3 to drive the first shift register SR1 and the third shift register SR3. In some embodiments, as shown in FIGS. 4, 5 and 11 (taking the transistor being a P-type transistor as an example), the first-type clock signal end (configured to load the first-type clock signal KA) of the first shift register SR1 is electrically connected to the third clock signal wiring (configured to load the third clock signal CK3), the second-type clock signal end of the first shift register SR1 is electrically connected to the first clock signal wiring, and the signal output end corresponding to the first shift register SR1 is the signal output end OUT1.

Figure 5:
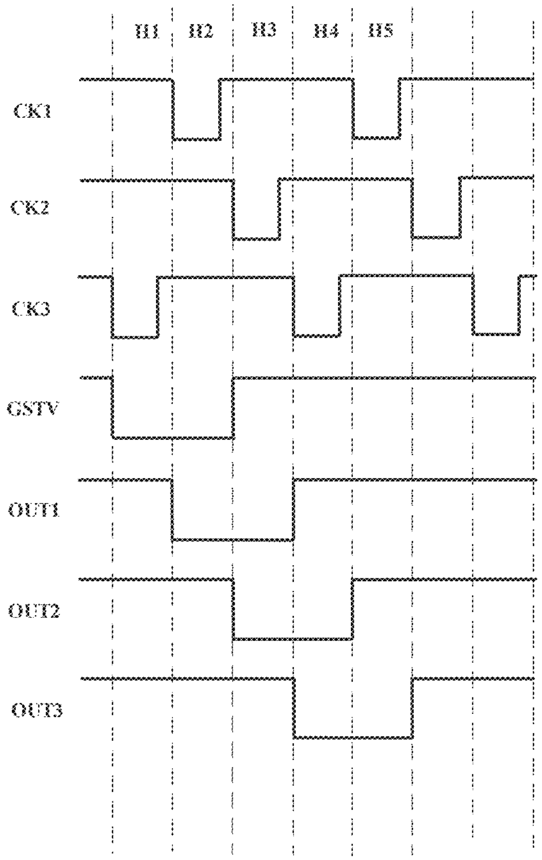
FIG. 5 is a driving timing diagram of a gate driving circuit in an embodiment of the present disclosure.
Figure 12:
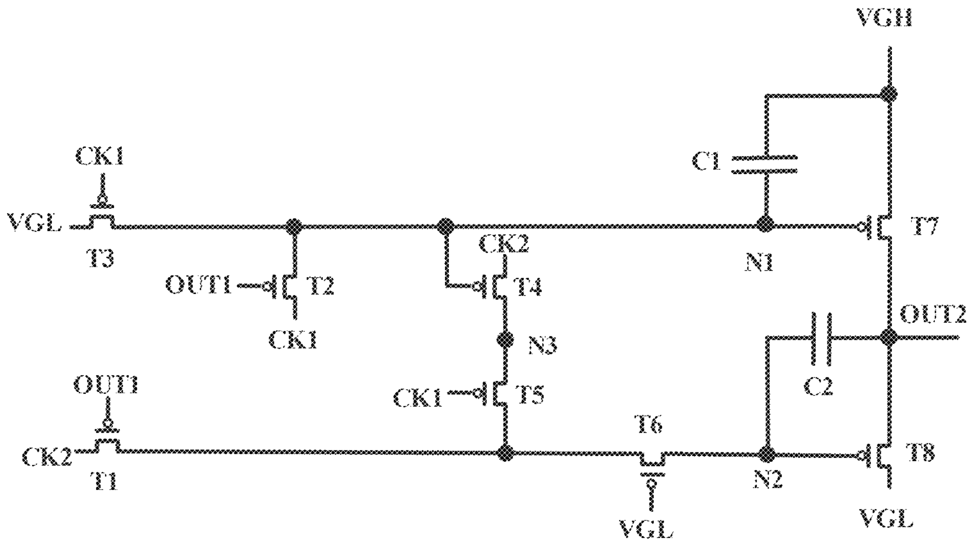
FIG. 12 is a schematic diagram of a second shift register in an embodiment of the present disclosure.

As shown in FIGS. 4, 5 and 12 (taking the transistor being a P-type transistor as an example), the first-type clock signal end of the second shift register SR2 is electrically connected to the first clock signal wiring, the second-type clock signal end of the second shift register SR2 is electrically connected to the second clock signal wiring, and the signal output end OUT corresponding to the second shift register SR2 is the signal output end OUT2.

Figure 13:
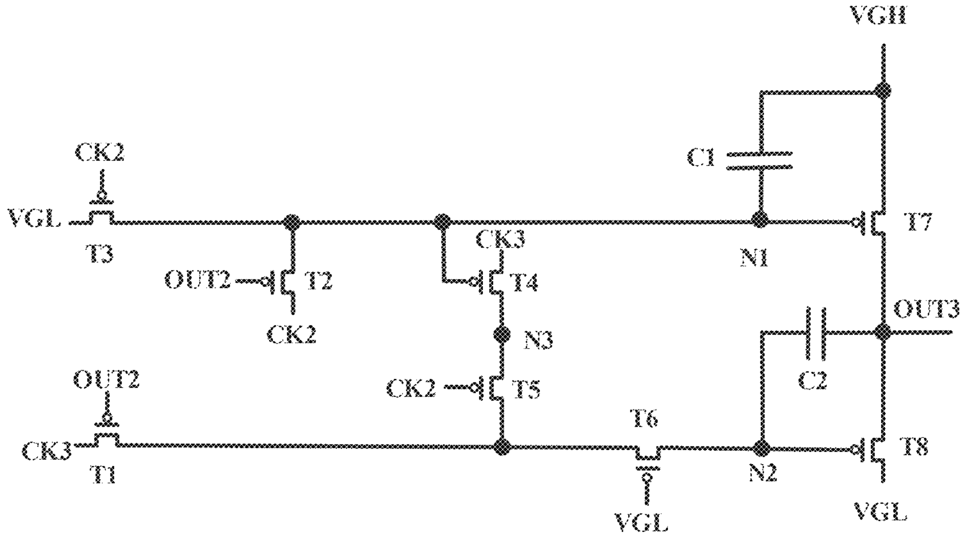
FIG. 13 is a schematic diagram of a third shift register in an embodiment of the present disclosure.

As shown in FIGS. 4, 5 and 13 (taking the transistor being a P-type transistor as an example), the first-type clock signal end of the third shift register SR3 is electrically connected to the second clock signal wiring, the second-type clock signal end of the third shift register SR3 is electrically connected to the third clock signal wiring, and the signal output end OUT corresponding to the third shift register SR3 is the signal output end OUT3.

In this embodiment, the display panel may provide three clock signals, such as the first clock signal CK1, the second clock signal CK2 and the third clock signal CK3, to the gate driving circuit GOA, and each shift register SR may use two of the three clock signals to ensure its normal operation. In this way, the clock signals of the first shift register SR1, the second shift register SR2 and the third shift register SR3 may be multiplexed with each other, which can reduce the number of clock signals required for the gate driving circuit, and thus reduce the number of clock signal wirings provided by the display panel.

Optionally, the amplitude of the second level of the first clock signal wiring, the amplitude of the second level of the second clock signal wiring, and the amplitude of the second level of the third clock signal wiring are the same, and are all 0.5~3 V higher than the amplitude of the signal of the second supply voltage end.

For example, the high level power supply voltage VGH is 7 V, the low level power supply voltage VGL is −7 V, and the first level and the second level of the first clock signal CK1, the first level and the second level of the second clock signal CK2, and the first level and the second level of the third clock signal CK3 all have an amplitude of 8 V. This enables the third electrode of the seventh transistor T7 and the third electrode of the eighth transistor T8 to be written with different voltages from the source and the drain, ensuring the gate-source voltage difference VGS>0 (taking the P-type MOS transistor as an example) in design, preventing screen splitting caused by the failure of the transistor due to positive bias of the threshold voltage Vth under high load operation conditions (i.e., high temperature conditions or high voltage aging conditions), and enhancing the yield and trustworthiness of the product.

Optionally, the time length of the first level of the first clock signal wiring, the time length of the first level of the second clock signal wiring, and the time length of the first level of the third clock signal wiring are the same, and do not exceed one-third of a clock period. For example, all of them are ⅓ of the clock period, ¼ of the clock period, ⅕ of the clock period, or ⅙ of the clock period.

Optionally, the start timepoint of the first level of the first clock signal wiring differs by two-thirds of a clock period from the start timepoint of the first level of the third clock signal wiring following the first level of the first clock signal wiring;

- the start timepoint of the first level of the second clock signal wiring differs by two-thirds of the clock period from the start timepoint of the first level of the first clock signal wiring following the first level of the second clock signal wiring; and
- the start timepoint of the first level of the third clock signal wiring differs by two-thirds of the clock period from the start timepoint of the first level of the second clock signal wiring following the first level of the third clock signal wiring.

Of course, in other embodiments of the present disclosure, the clock signals of the first shift register SR1, the second shift register SR2 and the third shift register SR3 may not be multiplexed with each other, e.g., the display panel may be provided with six clock signal wirings to provide clock signals required for the three shift registers respectively.

In the following, taking each transistor being a P-type transistor as an example, the operation principle of the shift register in this exemplary embodiment is explained in detail in connection with the driving timing diagram in FIG. 5. In the example of FIG. 5, the first level of the clock signal is a low level, and the second level of the clock signal is a high level. The first power supply voltage is a low level power supply voltage VGL, and the second power supply voltage is a high level power supply voltage VGH.

In the first clock signal CK1, the second clock signal CK2 and the third clock signal CK3 of the example of FIG. 5, the third clock signal CK3 and the first clock signal CK1 may be combined to form a first clock signal group for driving the first shift register SR1. Specifically, the third clock signal CK3 is the first-type clock signal KA in the first clock signal group, and the first clock signal CK1 is the second-type clock signal KB in the first clock signal group. Driven by the first clock signal group, the first shift register SR1 may output, according to a start signal GSTV of the signal input end (e.g., an externally input start signal GSTV, or a first level scanning signal output from a shift register of a previous stage that can be used as the start signal GSTV), a first level scanning signal of this stage from the signal output end OUT1.

By way of example, in the first clock signal CK1, the second clock signal CK2 and the third clock signal CK3 of the example of FIG. 5, the first clock signal CK1 and the second clock signal CK2 may be combined to form a second clock signal group for driving the second shift register SR2. Specifically, the first clock signal CK1 is the first-type clock signal KA in the second clock signal group, and the second clock signal CK2 is the second-type clock signal KB in the second clock signal group. Driven by the second clock signal group, the second shift register SR2 may output, according to a start signal GSTV of the signal input end (e.g., an externally input start signal GSTV, or a first level scanning signal output from a shift register of a previous stage that can be used as the start signal GSTV), a first level scanning signal of this stage from the signal output end OUT2.

By way of example, in the first clock signal CK1, the second clock signal CK2 and the third clock signal CK3 of the example of FIG. 5, the second clock signal CK2 and the third clock signal CK3 may be combined to form a third clock signal group. Specifically, the second clock signal CK2 is the first-type clock signal KA in the third clock signal group, and the third clock signal CK3 is the second-type clock signal KB in the third clock signal group. Driven by the third clock signal group, the third shift register SR3 may output, according to a start signal GSTV of the signal input end (e.g., an externally input start signal GSTV, or a first level scanning signal output from a shift register of a previous stage that can be used as the start signal GSTV), a first level scanning signal of this stage from the signal output end OUT3.

The principle of the shift register is exemplarily explained by taking the operation process of the first shift register SR1 (taking the transistor being a P-type transistor as an example) as an example. In this example, the third clock signal CK3 is the first-type clock signal KA of this shift register, and the first clock signal CK1 is the second-type clock signal KB of this shift register.

Figure 6:
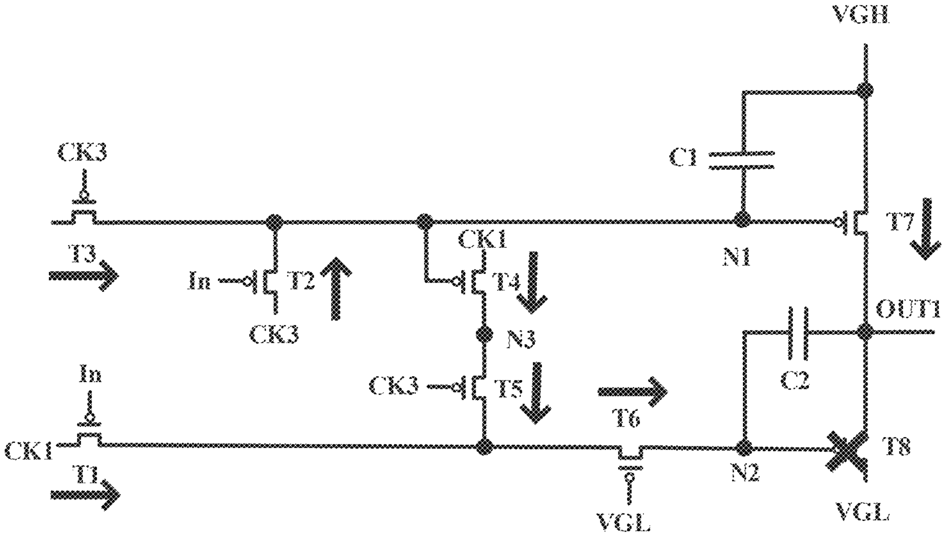
FIG. 6 is a circuit state diagram of a first shift register circuit in a first time period.

In a first time period H1, as shown in FIGS. 5 and 6, the first clock signal CK1 is a second level, and the third clock signal CK3 is a first level. The start signal GSTV is loaded on the signal input end In of the first shift register SR1. The start signal GSTV is the first level. It can be understood that the first shift register SR1 in this example is a shift register of the first stage in the gate driving circuit. In the first time period H1, the first transistor T1, the second transistor T2, the third transistor T3, and the fifth transistor T5 are turned on. The low level power supply voltage VGL is transmitted to the first node N1 through the third transistor T3, causing the seventh transistor T7 to be turned on, and causing the first level to be stored in the first capacitor C1. The high level power supply voltage VGH is transmitted to the signal output end OUT1 through the seventh transistor T7, and at this time, the signal output end OUT1 outputs the second level. As the low level power supply voltage VGL is loaded to the third electrode of the fourth transistor T4, the fourth transistor T4 is turned on, and thus the second level of the first clock signal CK1 is loaded to the second node N2, causing the eighth transistor T8 to be turned off, and causing the second level of the first clock signal CK1 to be stored in the second capacitor C2.

Figure 7:
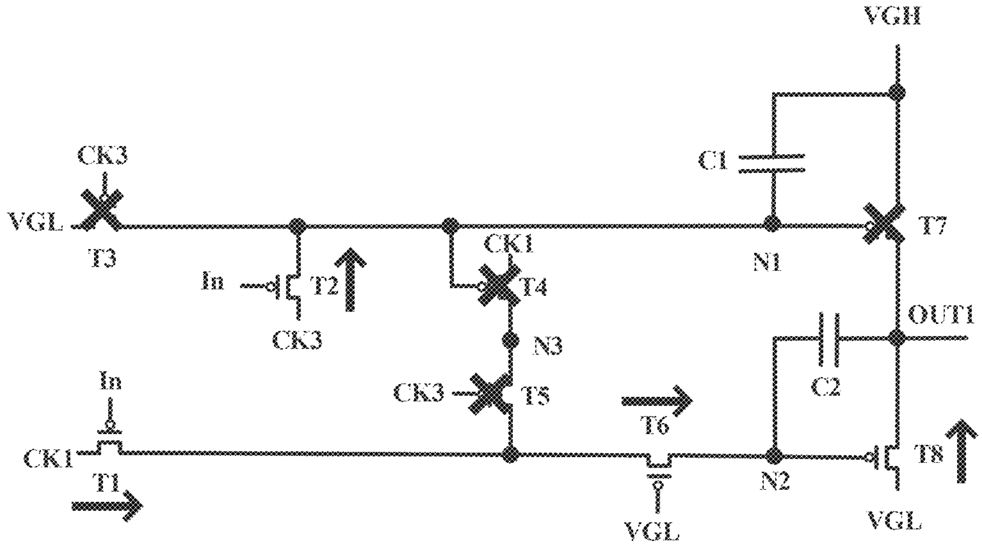
FIG. 7 is a circuit state diagram of a first shift register circuit in a second time period.

In a second time period H2, as shown in FIGS. 5 and 7, each of the first clock signal CK1 and the start signal GSTV is a first level, the signal input end In is the first level, and the third clock signal CK3 is a second level. The first transistor T1, the second transistor T2 and the sixth transistor T6 are turned on. The third transistor T3 and the fifth transistor T5 are turned off. The second level of the third clock signal CK3 is transmitted to the first node N1 through the second transistor T2, causing the fourth transistor T4 and the seventh transistor T7 to be turned off, and causing the second level to be written into the first capacitor C1. The first level of the first clock signal CK1 is transmitted to the second node N2 through the first transistor T1 and the sixth transistor T6, causing the eighth transistor T8 to be turned on, and at the same time, the first level is written into the second capacitor C2, then the low level power supply voltage VGL is transmitted to the signal output end OUT1 through the eighth transistor T8, and at this time, the signal output end OUT1 outputs the low level power supply voltage VGL.

Figure 8:
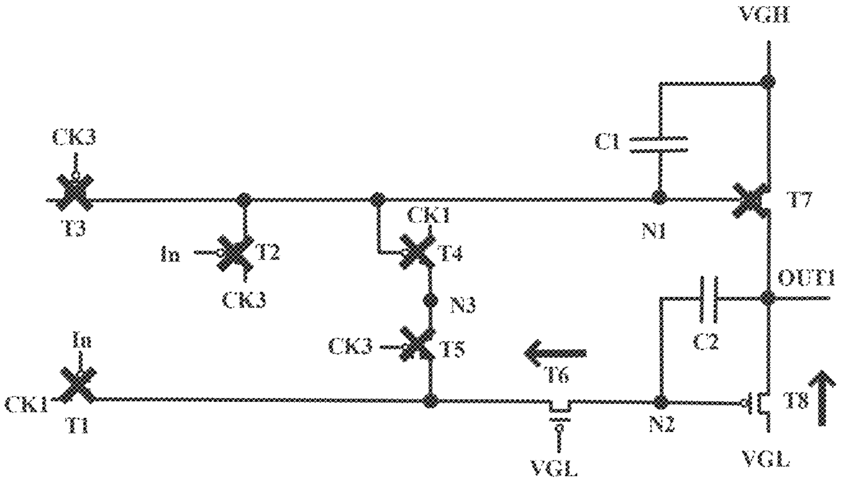
FIG. 8 is a circuit state diagram of a first shift register circuit in a third time period.

In a third time period H3, as shown in FIGS. 5 and 8, each of the first clock signal CK1, the third clock signal CK3 and the start signal GSTV is a second level, and the signal input end In is connected to the second level of the start signal GSTV. The first transistor T1, the second transistor T2, the third transistor T3, and the fifth transistor T5 are turned off, and the sixth transistor T6 is turned on. The second level of the first node N1 is maintained, then the fourth transistor T4 and the seventh transistor T7 are maintained off. The first level of the second node is maintained, then the eighth transistor T8 is turned on, and the low level power supply voltage VGL is transmitted to the signal output end OUT1 through the eighth transistor T8. At this time, the signal output end OUT1 outputs the low level power supply voltage VGL.

Figure 9:
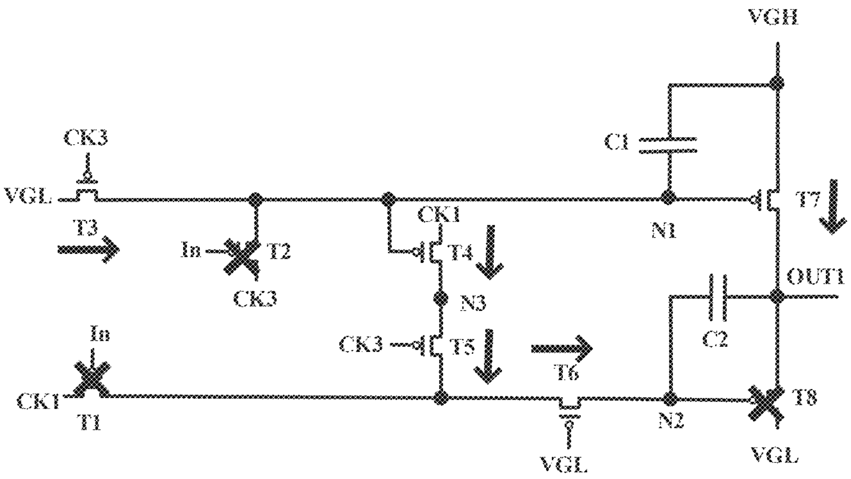
FIG. 9 is a circuit state diagram of a first shift register circuit in a fourth time period.

In a fourth time period H4, as shown in FIGS. 5 and 9, each of the first clock signal CK1 and the start signal GSTV is a second level, the third clock signal CK3 is a first level, and the signal input end In is connected to the second level of the start signal GSTV. Both the third transistor T3 and the fifth transistor T5 are turned on, and both the first transistor T1 and the second transistor T2 are turned off. The low level power supply voltage VGL is loaded on the third electrode of the sixth transistor T6, and then the sixth transistor T6 is turned on. The low level power supply voltage VGL is loaded through the third transistor T3 to the third electrode of the fourth transistor T4 and the first node N1, and thus the fourth transistor T4 and the seventh transistor T7 are also turned on respectively. At the same time, the first capacitor C1 holds the low level power supply voltage VGL, and the high level power supply voltage VGH is transmitted to the signal output end OUT1 through the seventh transistor T7. At this time, the signal output end OUT1 outputs the second level. The second level of the first clock signal CK1 is transmitted to the second node N2 through the fourth transistor T4, the third node N3, the fifth transistor T5, and the sixth transistor T6, then the eighth transistor T8 is in an off state, and the second level of the first clock signal CK1 is stored in the second capacitor C2.

Figure 10:
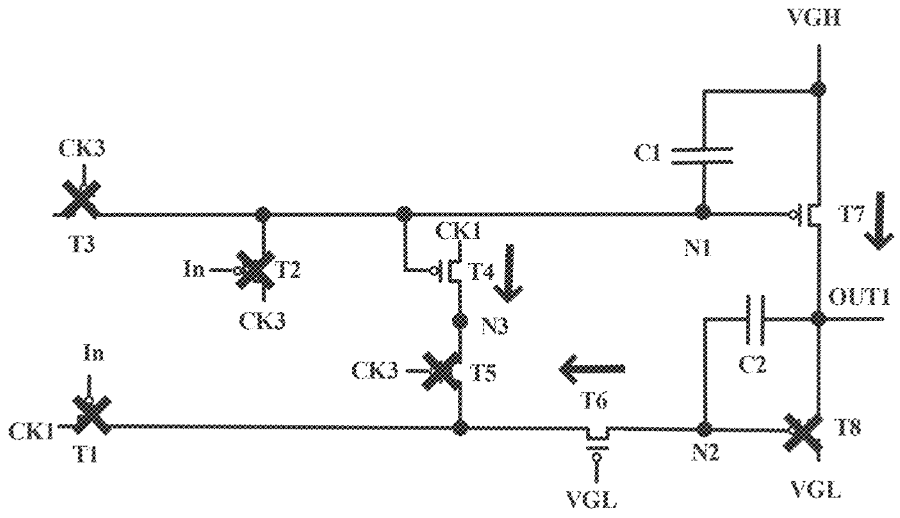
FIG. 10 is a circuit state diagram of a first shift register circuit in a fifth time period.

In a fifth time period H5, as shown in FIGS. 5 and 10, each of the third clock signal CK3 and the start signal GSTV is a second level, the first clock signal CK1 is a first level, and the signal input end In is connected to the second level of the start signal GSTV, then the first transistor T1, the second transistor T2, the third transistor T3, and the fifth transistor T5 are turned off. Since the sixth transistor T6 is loaded with the low level power supply voltage VGL, then the sixth transistor T6 is turned on. The second capacitor C2 causes the second node N2 to maintain the second level, enabling the eighth transistor T8 to maintain off. The first capacitor C1 causes the first level of the first node N1 to be maintained, enabling the seventh transistor T7 to maintain on. As a result, the high level power supply voltage VGH is transmitted to the signal output end OUT1 through the seventh transistor T7, and at this time, the signal output end OUT1 outputs the second level.

It should be noted that the above-described first-type clock signal KA including the third clock signal CK3, and the above-described second-type clock signal KB including the first clock signal CK1 are limited to be used in the above-described exemplary embodiment.

Based on the above description, it can be seen that the shift register in this exemplary embodiment completes the conversion from outputting a second level signal to outputting a first level signal in the first time period H1 to the third time period H3; furthermore, in the Tf phase of the gate driving circuit of the low frequency LTPS, a square-wave signal can be output stably, avoiding the occurrence of waveform jitter, reducing the possibility of the occurrence of mura in the product, and improving the image quality of the product.

Compared to the prior art, the gate driving circuit provided in this exemplary embodiment has a simple structure, which is conducive to realizing the design of a display panel with a narrow border, and at the same time, on the basis of the stable output of the shift register, the output stability of the gate driving circuit is improved.

It should be understood that the present disclosure does not limit its application to the detailed structure and arrangement of the components proposed in this specification. The present disclosure can have other embodiments and can be implemented and performed in various ways. The aforementioned forms of deformation and modification fall within the scope of the present disclosure. It should be understood that the present disclosure disclosed and limited in this specification extends to all alternative combinations of two or more individual features mentioned or apparent in the text and/or accompanying drawings. All of these different combinations constitute a plurality of alternative aspects of the present disclosure. The embodiments of this specification illustrate the best ways known to be configured to implement the present disclosure and will enable those skilled in the art to use the present disclosure.

What is claimed is:

1. A shift register, comprising:

a first input sub-circuit, configured to cause, in response to a first level of a first-type clock signal end, a signal of a first power supply voltage end to be written into a first node;

a second input sub-circuit, configured to cause, in response to a first level on a signal input end, a signal of the first-type clock signal end to be written into the first node;

a first output sub-circuit, comprising a first output unit, wherein the first output unit is configured to cause, in response to a first level on the first node, a signal of a second power supply voltage end to be written into a signal output end;

a first control sub-circuit, configured to cause, in response to the first level on the signal input end, a signal of a second-type clock signal end to be written into a second node;

a second control sub-circuit, configured to cause, in response to the first level on the first node, the signal of the second-type clock signal end to be written into a third node;

a third control sub-circuit, configured to cause, in response to the first level of the first-type clock signal end, conduction between the third node and the second node; and a second output sub-circuit, comprising a second output unit, wherein the second output unit is configured to cause, in response to a first level on the second node, the signal of the first power supply voltage end to be written into the signal output end.

2. The shift register according to claim 1, wherein the first control sub-circuit comprises a first transistor, a first electrode of the first transistor is electrically connected to the second-type clock signal end, a third electrode of the first transistor is electrically connected to the signal input end, and a second electrode of the first transistor is electrically connected to the second node.

3. The shift register according to claim 1, wherein the second input sub-circuit comprises a second transistor, a first electrode of the second transistor is electrically connected to the first-type clock signal end, a third electrode of the second transistor is electrically connected to the signal input end, and a second electrode of the second transistor is electrically connected to the first node.

4. The shift register according to claim 1, wherein the second control sub-circuit comprises a fourth transistor, a first electrode of the fourth transistor is electrically connected to the second-type clock signal end, a third electrode of the fourth transistor is electrically connected to the first node, and a second electrode of the fourth transistor is electrically connected to the third node.

5. The shift register according to claim 1, wherein the first input sub-circuit comprises a third transistor, a first electrode of the third transistor is electrically connected to the first power supply voltage end, a third electrode of the third transistor is electrically connected to the first-type clock signal end, and a second electrode of the third transistor is electrically connected to the first node:

the third control sub-circuit comprises a fifth transistor, a first electrode of the fifth transistor is electrically connected to the third node, a third electrode of the fifth transistor is electrically connected to the first-type clock signal end, and a second electrode of the fifth transistor is electrically connected to the second node;

the first output unit comprises a seventh transistor, a first electrode of the seventh transistor is electrically connected to the second power supply voltage end, a third electrode of the seventh transistor is electrically connected to the first node, and a second electrode of the seventh transistor is electrically connected to the signal output end; and the second output unit comprises an eighth transistor, a first electrode of the eighth transistor is electrically connected to the first power supply voltage end, a third electrode of the eighth transistor is electrically connected to the second node, and a second electrode of the eighth transistor is electrically connected to the signal output end.

6. The shift register according to claim 1, further comprising:

a voltage regulator sub-circuit, wherein the voltage regulator sub-circuit is electrically connected to the second node and a fourth node respectively; and the voltage regulator sub-circuit is configured to write, under control of the signal of the first power supply voltage end, a voltage of the fourth node into the second node; wherein the fourth node is electrically connected to the first control sub-circuit and the third control sub-circuit.

7. The shift register according to claim 6, wherein the voltage regulator sub-circuit comprises a sixth transistor, a first electrode of the sixth transistor is electrically connected to the fourth node, a third electrode of the sixth transistor is electrically connected to the first power supply voltage end, and a second electrode of the sixth transistor is electrically connected to the second node.

8. The shift register according to claim 1, wherein the first output sub-circuit further comprises a first capacitor, a first electrode plate of the first capacitor is electrically connected to the first node, and a second electrode plate of the first capacitor is electrically connected to the second power supply voltage end; and the second output sub-circuit further comprises a second capacitor, a first electrode plate of the second capacitor is electrically connected to the second node, and a second electrode plate of the second capacitor is electrically connected to the signal output end.

9. The shift register according to claim 1, wherein a time length of the first level of the first-type clock signal end, and a time length of a first level of the second-type clock signal end are the same, and do not exceed one-third of a clock period.

10. The shift register according to claim 9, wherein the first level of the first-type clock signal end is one-third of the clock period earlier than the first level of the second-type clock signal end.

11. The shift register according to claim 9, wherein an amplitude of a second level of the first-type clock signal end, and an amplitude of a second level of the second-type clock signal end are greater than an amplitude of the signal of the second power supply voltage end.

12. A gate driving circuit, comprising a plurality of shift registers cascaded in sequence, wherein the shift register comprises:

a first input sub-circuit, configured to cause, in response to a first level of a first-type clock signal end, a signal of a first power supply voltage end to be written into a first node;

a second input sub-circuit, configured to cause, in response to a first level on a signal input end, a signal of the first-type clock signal end to be written into the first node;

a first output sub-circuit, comprising a first output unit, wherein the first output unit is configured to cause, in response to a first level on the first node, a signal of a second power supply voltage end to be written into a signal output end;

a first control sub-circuit, configured to cause, in response to the first level on the signal input end, a signal of a second-type clock signal end to be written into a second node;

a second control sub-circuit, configured to cause, in response to the first level on the first node, the signal of the second-type clock signal end to be written into a third node;

a third control sub-circuit, configured to cause, in response to the first level of the first-type clock signal end, conduction between the third node and the second node; and a second output sub-circuit, comprising a second output unit, wherein the second output unit is configured to cause, in response to a first level on the second node, the signal of the first power supply voltage end to be written into the signal output end;

in two adjacent stages of the shift registers, the signal output end of the shift register of a previous stage is electrically connected to the signal input end of the shift register of a next stage;

in the gate driving circuit, the signal input end of the shift register of a first stage is electrically connected to a start signal end;

the gate driving circuit comprises a plurality of shift register groups, wherein the shift register group comprises a first shift register, a second shift register and a third shift register cascaded in sequence;

the first-type clock signal end of the first shift register is electrically connected to a third clock signal wiring, and the second-type clock signal end of the first shift register is electrically connected to a first clock signal wiring;

the first-type clock signal end of the second shift register is electrically connected to the first clock signal wiring, and the second-type clock signal end of the second shift register is electrically connected to a second clock signal wiring; and the first-type clock signal end of the third shift register is electrically connected to the second clock signal wiring, and the second-type clock signal end of the third shift register is electrically connected to the third clock signal wiring.

13. The gate driving circuit according to claim 12, wherein an amplitude of a second level of the first clock signal wiring, an amplitude of a second level of the second clock signal wiring, and an amplitude of a second level of the third clock signal wiring are the same, and are 0.5~3 V higher than an amplitude of the signal of the second power supply voltage end.

14. The gate driving circuit according to claim 12, wherein a time length of a first level of the first clock signal wiring, a time length of a first level of the second clock signal wiring, and a time length of a first level of the third clock signal wiring are the same, and do not exceed one-third of a clock period.

15. The gate driving circuit according to claim 12, wherein a start timepoint of a first level of the first clock signal wiring differs by two-thirds of a clock period from a start timepoint of a first level of the third clock signal wiring following the first level of the first clock signal wiring;

a start timepoint of a first level of the second clock signal wiring differs by two-thirds of the clock period from the start timepoint of the first level of the first clock signal wiring following the first level of the second clock signal wiring; and the start timepoint of the first level of the third clock signal wiring differs by two-thirds of the clock period from the start timepoint of the first level of the second clock signal wiring following the first level of the third clock signal wiring.

16. A display panel, comprising a gate driving circuit, wherein the gate driving circuit comprises a plurality of shift registers cascaded in sequence, and the shift register comprises:

a first input sub-circuit, configured to cause, in response to a first level of a first-type clock signal end, a signal of a first power supply voltage end to be written into a first node;

a second input sub-circuit, configured to cause, in response to a first level on a signal input end, a signal of the first-type clock signal end to be written into the first node;

a first output sub-circuit, comprising a first output unit, wherein the first output unit is configured to cause, in response to a first level on the first node, a signal of a second power supply voltage end to be written into a signal output end;

a first control sub-circuit, configured to cause, in response to the first level on the signal input end, a signal of a second-type clock signal end to be written into a second node;

a second control sub-circuit, configured to cause, in response to the first level on the first node, the signal of the second-type clock signal end to be written into a third node;

a third control sub-circuit, configured to cause, in response to the first level of the first-type clock signal end, conduction between the third node and the second node; and a second output sub-circuit, comprising a second output unit, wherein the second output unit is configured to cause, in response to a first level on the second node, the signal of the first power supply voltage end to be written into the signal output end;

in two adjacent stages of the shift registers, the signal output end of the shift register of a previous stage is electrically connected to the signal input end of the shift register of a next stage;

in the gate driving circuit, the signal input end of the shift register of a first stage is electrically connected to a start signal end;

the gate driving circuit comprises a plurality of shift register groups, wherein the shift register group comprises a first shift register, a second shift register and a third shift register cascaded in sequence;

the first-type clock signal end of the first shift register is electrically connected to a third clock signal wiring, and the second-type clock signal end of the first shift register is electrically connected to a first clock signal wiring;

the first-type clock signal end of the second shift register is electrically connected to the first clock signal wiring, and the second-type clock signal end of the second shift register is electrically connected to a second clock signal wiring; and the first-type clock signal end of the third shift register is electrically connected to the second clock signal wiring, and the second-type clock signal end of the third shift register is electrically connected to the third clock signal wiring.

* * * * *